(12) United States Patent
Tai et al.

(10) Patent No.: US 7,179,339 B2
(45) Date of Patent: *Feb. 20, 2007

(54) TERBIUM-DYSPROSIUM-IRON MAGNETOSTRICTIVE MATERIALS AND DEVICES USING THESE MATERIALS

(75) Inventors: Chiu-Ying Tai, Chelmsford, MA (US); Chandrashekhar H. Joshi, Bedford, MA (US)

(73) Assignee: Energen, Inc., Lowell, MA (US)

( * ) Notice: Subject to any disclaimer, the term of this patent is extended or adjusted under 35 U.S.C. 154(b) by 83 days.

This patent is subject to a terminal disclaimer.

(21) Appl. No.: 10/350,649

(22) Filed: Jan. 24, 2003

(65) Prior Publication Data

US 2005/0087265 A1 Apr. 28, 2005

(51) Int. Cl.
*H01F 1/055* (2006.01)

(52) U.S. Cl. .................................................. 148/301
(58) Field of Classification Search ................ 75/255, 75/246; 148/301
See application file for complete search history.

(56) References Cited

U.S. PATENT DOCUMENTS

| | | | | |
|---|---|---|---|---|
| 5,529,745 A | * | 6/1996 | Mori et al. | 419/38 |
| 6,012,521 A | * | 1/2000 | Zunkel et al. | 166/249 |
| 6,037,682 A | * | 3/2000 | Shoop et al. | 310/26 |
| 6,071,357 A | * | 6/2000 | Guruswamy et al. | 148/301 |
| 6,230,799 B1 | * | 5/2001 | Slaughter et al. | 166/249 |
| 6,273,965 B1 | * | 8/2001 | Pulvirenti et al. | 148/301 |

* cited by examiner

*Primary Examiner*—Ngoclant T. Mai
(74) *Attorney, Agent, or Firm*—Sam Pasternack; Choate Hall & Stewart LLP

(57) ABSTRACT

A terbium-dysprosium-iron magnetostrictive material of the type $Tb_{1-x}Dy_xFe_{2-y}$ wherein x is less than 0.7, and y is less than or equal to 0.1, and devices using these materials.

12 Claims, 5 Drawing Sheets

TERBIUM-DYSPROSIUM-IRON MAGNETOSTRICTIVE MATERIALS AND DEVICES USING THESE MATERIALS

FIELD OF THE INVENTION

This invention discloses high strength magnetostrictor materials that can be used over a broad range of temperatures from above room temperature to near absolute zero.

BACKGROUND OF THE INVENTION

Although magnetostriction was first discovered by Joule in 1847 in iron, high magnetostriction (almost 1%) was first discovered in the rare-earth elements dysprosium (Dy) and terbium (Tb) at cryogenic temperatures in 1963.

Both terbium and dysprosium derive their magnetism from the partially filled, outermost shell of electrons ($4f$). The anisotropic distribution of electrons in this shell results in highly anisotropic magnetic and magnetostrictive behaviors. This anisotropy causes the magnetostriction to change suddenly when an activation magnetic field is applied. Below this activation field, there is little magnetostriction and above it the material is saturated at the maximum magnetostriction. Terbium displays a positive anisotropy whereas dysprosium has a negative anisotropy.

To obtain a smooth magnetostriction, the two elements are alloyed together. The alloy $Tb_{0.6}Dy_{0.4}$ exhibits the highest magnetostriction (6300 ppm) but its ordering temperature is about 150K. As an actuator material, it is poor because of its limited mechanical strength.

Since 1995, the $Tb_{1-x}Dy_xZn$ alloy has emerged as the preferred magnetostrictive material for applications at temperatures below ~150K. See U.S. Pat. No. 4,906,879. The magnetostriction of this alloy is comparable to the huge magnetostriction of the rare earth elements Tb and Dy themselves (~0.5% at 77K) and this material is stronger than TbDy. Single crystals are required in almost all cases. For the rare earth elements, orientation is very important since the magnetization remains essentially in the basal plane for all practical magnetic fields. Crystallites oriented in directions out of the plane produce almost no magnetostriction.

A search for high magnetostriction materials at room temperature led to alloying of these rare-earth materials with transition metals such as iron (Fe), culminating in the discovery of high magnetostriction in the Laves phase compound $TbFe_2$. Soon thereafter, dysprosium was added to this compound to reduce the anisotropy. $Tb_{1-x}Dy_xFe_{2-y}$ ($0.7 \leq x \leq 0.8$, $0 \leq y \leq 0.1$) represents the room temperature magnetostrictor commonly referred to as Terfenol-D. See U.S. Pat. No. 4,308,474.

$Tb_{0.3}Dy_{0.7}Fe_{1.95}$ has been described as the optimum composition for room temperature magnetostrictive applications. According to Hathaway and Clark [MRS Bulletin, Vol. XVIII, No. 4, pp. 34–41], this compound shows the highest magnetostriction at room temperature. Measurements of magnetostriction at temperatures below room temperature indicate the magnetostriction increases for decreasing temperature to 250K and then decreases rapidly as the temperature decreases below that range, leading to the conclusion that this material is not a good magnetostrictor at cryogenic temperatures (<250K). See FIG. 1.

SUMMARY OF THE INVENTION

This invention features a terbium-dysprosium-iron magnetostrictive material of the type $Tb_{1-x}Dy_xFe_{2-y}$ wherein x is less than 0.7 and y is less than or equal to 0.1, the material exhibiting magnetostriction of at least about 1000 ppm at all temperatures below 293K. In the preferred embodiment, x is approximately 0.55, and y is approximately 0.1. The material may include up to about 5% impurities, particularly copper and silicon, which can be present at up to about 1% each. Also featured are devices using these materials.

BRIEF DESCRIPTION OF THE DRAWINGS

Other objects, features and advantages will occur to those skilled in the art from the following description of preferred embodiments and the accompanying drawings, in which.

DETAILED DESCRIPTION OF THE PREFERRED EMBODIMENTS OF THE INVENTION

Figure 1:
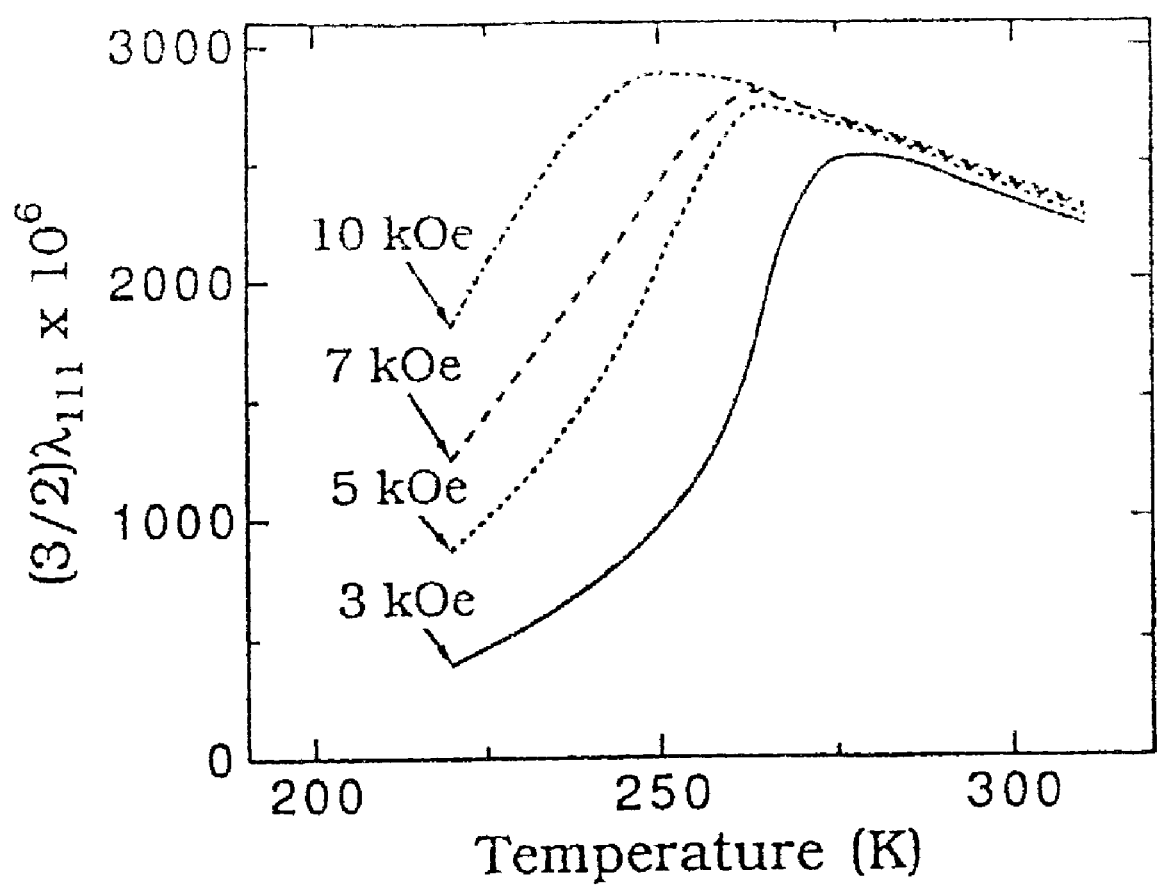
FIG. 1 is a graph of magnetostriction of the prior art material $Tb_{0.3}Dy_{0.7}Fe_{1.95}$ vs. temperature, indicating that magnetostriction decreases rapidly below 250K; [MRS Bulletin, Vol. XVIII, No. 4, p. 37]
Figure 2:
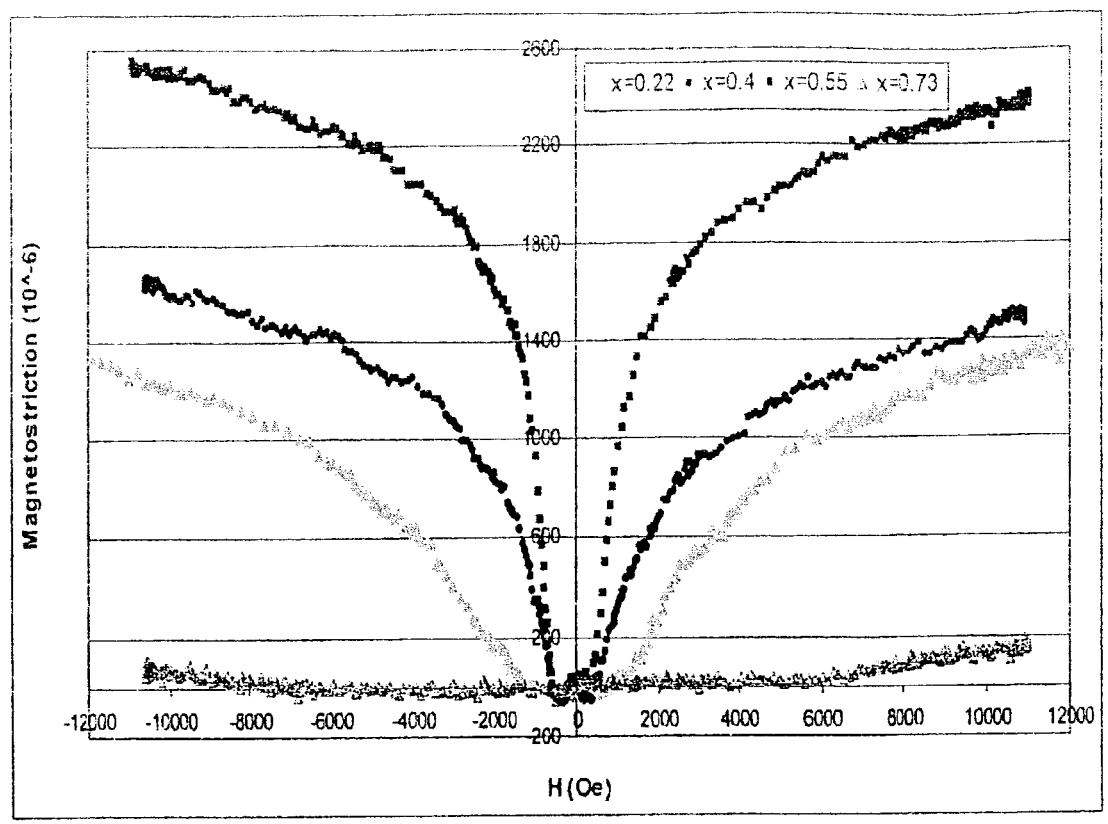
FIG. 2 is a graph of magnetostriction data of the $Tb_{1-x}Dy_xFe_{2-y}$ compounds of the invention, at 77K and with applied compressive stress of 1300 psi.
Figure 3:
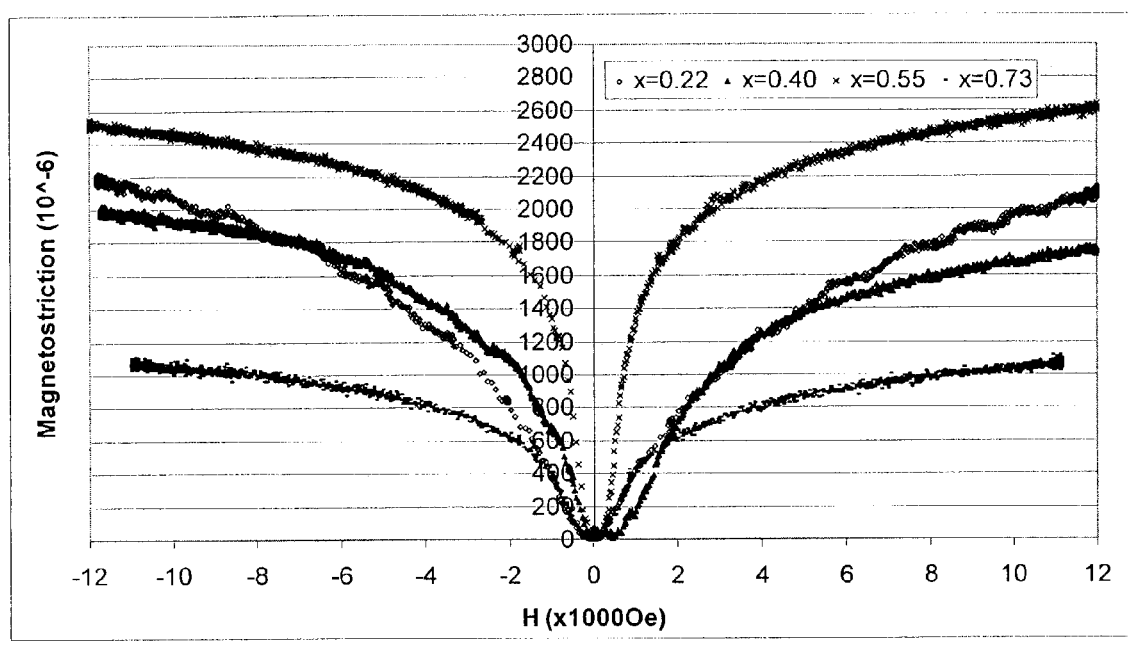
FIG. 3 is a graph of magnetostriction data of the $Tb_{1-x}Dy_xFe_{2-y}$ compounds of the invention at 4.2K and with applied compressive stress of 1300 psi (900 psi for the x=0.4 example)
Figure 4:
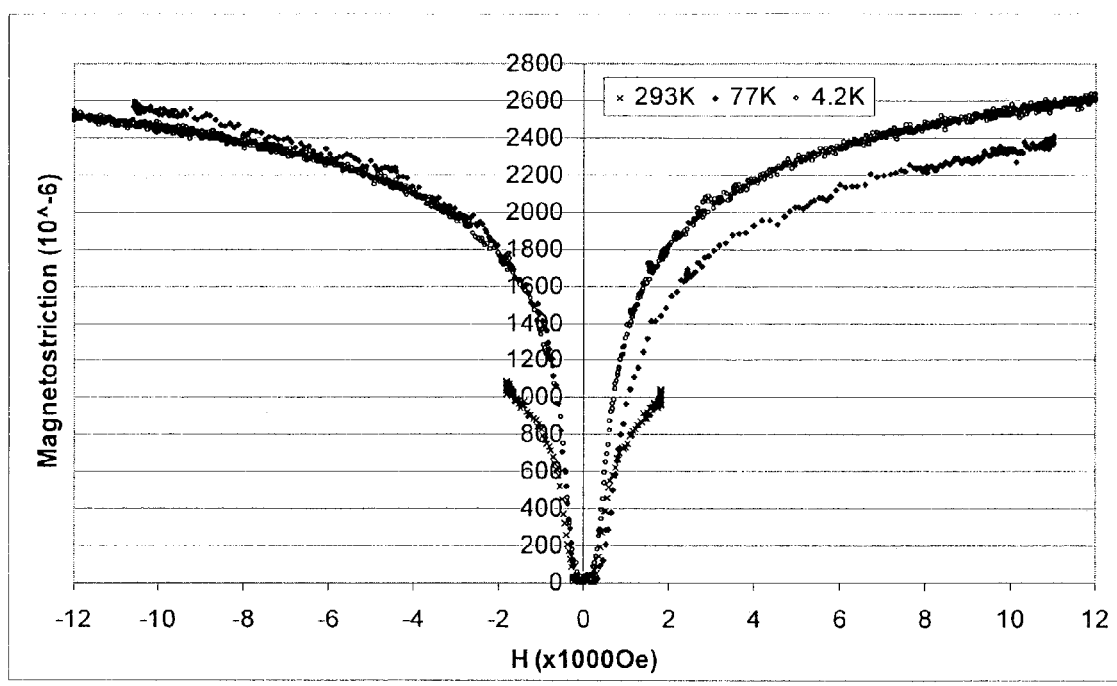
FIG. 4 is a graph of magnetostriction data of the $Tb_{0.45}Dy_{0.55}Fe_{1.9}$ compound of the invention at 293K, 77K, and 4.2K and with applied stress of 1300 psi.

It has been discovered that $Tb_{1-x}Dy_xFe_{2-y}$ compounds with different compositions (x from at least about 0.22 to less than about 0.7) have relatively large magnetostriction at cryogenic temperatures below 250K (e.g., 77K and 4.2K). See FIGS. 2 and 3. The compound with an x value of 0.73 represents the prior art Terfenol-D, which exhibits a saturation magnetostriction of less than 200 ppm at 77K and about 1000 ppm at 4.2K, amounts that are insufficient in many cases for useful commercial purposes. The inventive $Tb_{1-x}Dy_xFe_{2-y}$ compound with x=0.55 has the largest magnetostriction compared to either pure iron (less than 50 ppm at 293K) or commercially available magnetostrictive material Terfenol-D (800–1200 ppm at 293K) at different applying temperatures (room temperature –293K, and cryogenic temperatures –77K and 4.2K) (FIG. 4).

Although $Tb_{1-x}Dy_xZn$ has a high magnetostriction at cryogenic temperatures [See U. S. Pat. No. 4,906,879], commercial applications of this material are still limited due to its complex and therefore expensive fabrication process. The basic process consists of alloying the elements together to form an alloy ingot and then growing a single crystal from the ingot. The alloying process requires a sealed crucible since the boiling temperature of Zn ($T_{boil}$=1180K) is lower than the melting temperature of either Tb ($T_{melt}$=1630K) or Dy (1682K). The sealed crucible is needed to prevent the loss of zinc during the alloying process. This additional work becomes a critical factor in the success or failure of the whole process and also increases the cost. With a closer match in the melting temperature of Fe ($T_{melt}$=1809K), Tb, and Dy, the same problem does not exist in the inventive $Tb_{1-x}Dy_xFe_{2-y}$. By the same Bridgman method, the fabrication process of $Tb_{1-x}Dy_xFe_{2-y}$ is relatively easier and cheaper than that of $Tb_{1-x}Dy_xZn$.

Based on the investigation mentioned above, $Tb_{1-x}Dy_xFe_{2-y}$ with certain compositions (x from 0.22 to 0.7) does have useful magnetostriction (typically defined as at least about 1000 ppm) at both room temperature and cryogenic temperatures (293K, 77K, and 4.2K), or even extended to higher temperatures that are below the Curie temperatures (Tc~697K for $TbFe_2$ and ~635K for $DyFe_2$, all the $Tb_{1-x}Dy_xFe_{2-y}$ compounds are believed to have their $T_C$ within this range). Also, the relative ease of material fabrication increases the potential applications of these compounds in cryogenic applications.

This invention also relates to such magnetostrictive materials with impurities, that can be used over a broad range of temperatures from above room temperature to near absolute zero, and still provides applicable magnetostriction at a relative low cost. The impurities include those listed in Tables I and II below, as well as nitrogen, oxygen and carbon.

It has been found herein that varieties of impurities can be tolerated in the inventive rare earth—transition metal magnetostrictive materials. These impurities are usually brought into the final product either from the original raw materials or from specific manufacturing processes. Use of raw materials with higher levels of impurities will lead to lower production costs.

Figure 5:
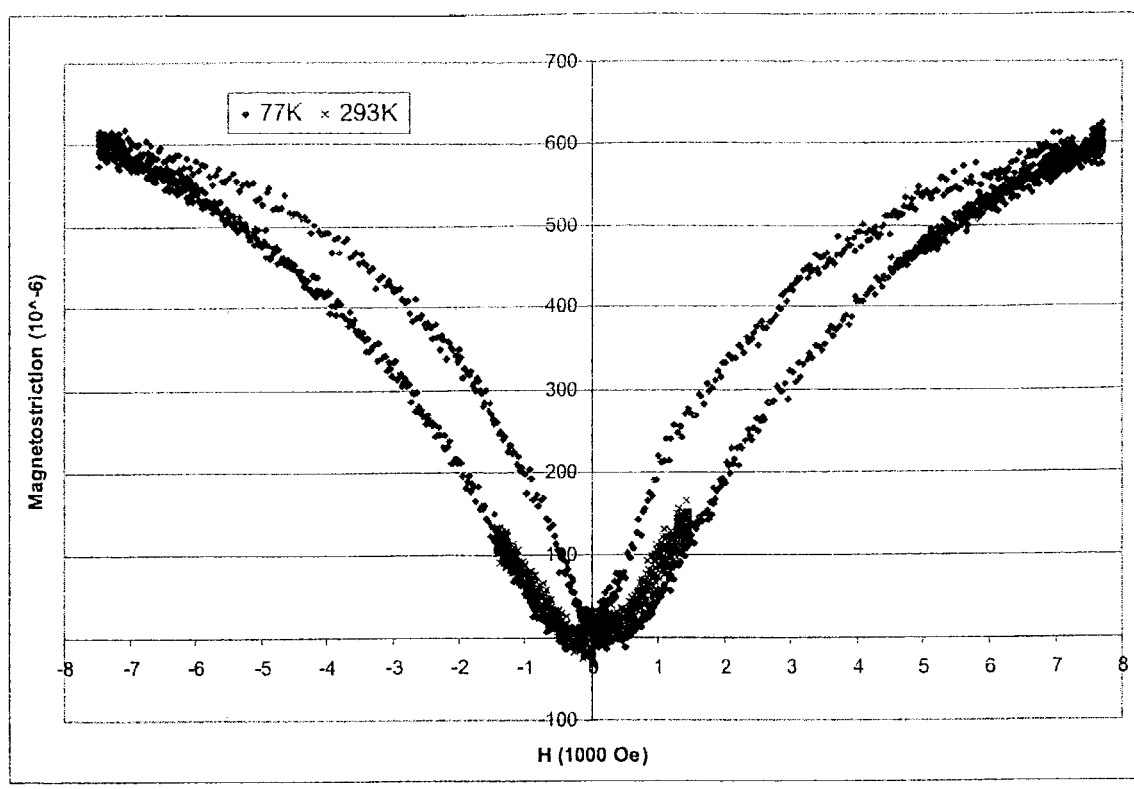
FIG. 5 is a graph of magnetostriction data of the inventive $Tb_{0.45}Dy_{0.55}Fe_{0.95}$ material, with impurities as in Table I, at 293K and 77K.

In the present invention, this same composition is demonstrated to have high magnetostriction over the same range of temperature even though the sample is made with a high level of impurities of silicon and copper. A sample of $Tb_{1-x}Dy_xFe_{2-y}$ was fabricated with the composition of x=0.55 and y=0.05, using standard alloying and crystal growth techniques known to those knowledgeable in the art. The detailed chemical composition of this sample is listed in Table I. The magnetostrictive performance shown in FIG. 5 indicates a high level of magnetostriction (~600 ppm) in this $Tb_{0.45}Dy_{0.55}Fe_{1.95}$ compound. It is expected that with some process optimization the magnetostriction can be increased significantly.

TABLE I

Detailed chemical compositions of $Tb_{0.45}Dy_{0.55}Fe_{1.95}$.

| Observed elements | Composition* |
|---|---|
| Terbuim (Tb) | 14.214 |
| Dysprosium (Dy) | 16.664 |
| Iron (Fe) | 67.492 |
| Aluminum (Al) | 0.423 |
| Barium (Ba) | <0.0006 |
| Calcium (Ca) | <0.0022 |
| Chromium (Cr) | 0.003 |
| Cobalt (Co) | 0.001 |
| Copper (Cu) | 0.207 |
| Holmium (Ho) | <0.0005 |
| Lead (Pb) | <0.0004 |
| Lithium (Li) | 0.203 |
| Manganese (Mn) | <0.0016 |
| Molybdenum (Mo) | <0.0009 |
| Nickel (Ni) | <0.0015 |
| Phosphorus (P) | <0.0028 |
| Praseodymium (Pr) | <0.0006 |
| Silicon (Si) | 0.782 |
| Sodium (Na) | <0.0038 |
| Tungsten (W) | 0.0005 |
| Vanadium (V) | 0.010 |
| Nitrogen (N) | 0.0025 |

TABLE I-continued

Detailed chemical compositions of $Tb_{0.45}Dy_{0.55}Fe_{1.95}$.

| Observed elements | Composition* |
|---|---|
| Oxygen (O) | 0.0415 |
| Carbon (C) | 0.0223 |

*Compositions are in atomic percent

Table II details the impurity content of the raw materials and samples of $Tb_{1-x}Dy_xFe_{2-y}$ (x≦0.7 and y≦0.1) of the invention. It is expected that impurity levels of up to 1 atomic % of each of these elements will not adversely affect the magnetostriction of the $Tb_{1-x}Dy_xFe_{2-y}$ family in the same manner as the Si and Cu impurities detailed herein, provided that the total level of impurities is below about 5%.

TABLE II

| Observed elements | All compositions* |
|---|---|
| Aluminum (Al) | 0–0.423 |
| Barium (Ba) | 0–0.139 |
| Calcium (Ca) | 0–0.009 |
| Chromium (Cr) | 0–0.050 |
| Cobalt (Co) | 0–0.017 |
| Copper (Cu) | 0–0.207 |
| Holmium (Ho) | 0–0.0054 |
| Lead (Pb) | 0–0.0014 |
| Lithium (Li) | 0–0.203 |
| Manganese (Mn) | 0–0.015 |
| Molybdenum (Mo) | 0–0.0018 |
| Nickel (Ni) | 0–0.022 |
| Phosphorus (P) | 0–0.015 |
| Praseodymium (Pr) | 0–0.0006 |
| Silicon (Si) | 0–0.782 |
| Sodium (Na) | 0–0.26 |
| Tungsten (W) | 0–0.0005 |
| Vanadium (V) | 0–0.12 |
| Nitrogen (N) | 0–0.004 |
| Oxygen (O) | 0–0.313 |
| Carbon (C) | 0–0.105 |

*All compositions are in atomic percent

The inventive $Tb_{1-x}Dy_xFe_{2-y}$ materials can be fabricated using techniques similar to those used for making Terfenol-D. Alloying and crystal growth can be accomplished using a liquid phase alloying in an open crucible because all of the constituents are liquid over a common temperature range. Crystal growth can be accomplished by a Bridgman, modified Bridgman, directional solidification, Czchrolski or other crystal growth techniques.

These materials have sufficient magnetostriction such that they can be applied to a range of cryogenic devices, including linear actuators, linear stepper motors, sensors, and so on.

A linear actuator consists of a rod of the magnetostrictive material that can be exposed to an adjustable magnetic field through an electric coil in which the electrical current can be adjusted, or a permanent magnet whose proximity to the rod can be adjusted. The adjustment of the current in the electric coil or the position of the permanent magnet relative to the rod will cause the rod to elongate in relation to the current or proximity of the magnet. The length change of the magnetostrictive rod inside the linear actuator makes this device an excellent linear motion controller. These actuators can also be used to build active vibration control devices and active positioners.

The same property can also be used to build sensors which sense changes of a magnetic field or stress, by detecting the geometry change of magnetostrictive materials.

The stepper motor uses three magnetostrictive actuators that enable it to move forward or backward in a stepwise motion. This motor can provide a stroke of several millimeters that is limited only by the length available for the translating rod.

Other embodiments of the invention will occur to those skilled in the art from the preceding description and the accompanying claims.

What is claimed is:

1. A terbium-dysprosium-iron magnetostrictive material of the formula $Tb_{1-x}Dy_xFe_{2-x}$ wherein $0.22 \leq x \leq 0.7$ and y is $\leq 0.1$ including impurities in the range of 2–5 percent, the impurities including copper and silicon and wherein said material exhibits a saturation magnetostriction of at least about 1000 ppm at 4.2K and 77K.

2. Devices comprising the material of claim 1.

3. The material of claim 1, wherein the material exhibits a saturation magnetostriction of at least 2000 ppm at 4.2K and 77K.

4. The material of claim 1, wherein x is approximately 0.55.

5. The material of claim 4, wherein y is approximately 0.1.

6. The material of claim 1, further comprising up to about 1% copper.

7. The material of claim 1, further comprising up to about 1% silicon.

8. The material of claim 1, wherein at temperatures from below 250K to 293K the material exhibits a magnetostriction of at least about 1000 ppm.

9. A terbium-dysprosium-iron magnetostrictive material of the formula $Tb_{1-x}Dy_xFe_{2-x}$ wherein x is about 0.55 and y is from 0.05 to 0.1, further including impurities in the range of 2–5 percent, the impurities including copper and silicon, wherein at temperatures from below 250K to 293K the material exhibits a magnetostriction of at least about 1000 ppm and wherein the material exhibits a saturation magnetostriction of at least 2000 ppm at 4.2K and 77K.

10. Devices comprising of material of claim 9.

11. The material of claim 9, further comprising up to about 1% cooper.

12. The material of claim 9, further comprising up to about 5% silicon.

* * * * *